(12) United States Patent
Chang et al.

(10) Patent No.: US 6,383,554 B1
(45) Date of Patent: May 7, 2002

(54) PROCESS FOR FABRICATING PLASMA WITH FEEDBACK CONTROL ON PLASMA DENSITY

(75) Inventors: Cheng-Hung Chang, Hsinchu Hsien; Keh-Chyang Leou; Chaung Lin, both of Hsinchu; Yi-Mei Yang, Taipei; Chuen-Horng Tsai, Hsinchu; I. G. Chen, Taichung, all of (TW)

(73) Assignee: National Science Council, Taipei (TW)

( * ) Notice: Subject to any disclaimer, the term of this patent is extended or adjusted under 35 U.S.C. 154(b) by 100 days.

(21) Appl. No.: 09/654,808

(22) Filed: Sep. 5, 2000

(51) Int. Cl.⁷ .................................................. B05D 3/14
(52) U.S. Cl. ......................... 427/10; 427/294; 427/570
(58) Field of Search ........................... 427/10, 570, 294

Primary Examiner—Bernard Pianalto
(74) Attorney, Agent, or Firm—J.C. Patents

(57) ABSTRACT

There is provided a process and its system for fabricating plasma with feedback control on plasma density. This process uses a heterodyne millimeter wave interferometer as a sensor to measure the plasma density in the process container and the plasma density that is needed in the plasma fabricating process, and then provides real-time information of the measurements to a digital control device which makes numerical calculations and then drives the RF power generator to change the RF output power so as to enable the plasma density in the plasma fabricating process to be close to the expected plasma density.

The conventional operation parameter method is to control air pressure, RF power, gas flow quantity, temperature and so on. However, it does not control the plasma parameter that has the most direct influence on the process. Therefore, this method cannot guarantee that, in the process of fabricating wafers, different batches of wafers will be operated under similar process plasma conditions. The present invention provides a process plasma source that can be directly controlled so as to obtain process plasma source of steady quality.

7 Claims, 8 Drawing Sheets

PROCESS FOR FABRICATING PLASMA WITH FEEDBACK CONTROL ON PLASMA DENSITY

BACKGROUND OF THE INVENTION

1. Field of the Invention

The present invention relates a process and its system for generating plasma with feedback control on plasma density. It particularly relates to a process that uses a heterodyne millimeter wave interferometer as sensor to measure the plasma density in the process container and the plasma density that is needed in the plasma generating process, and then provides real-time information of the measurements to a digital control device which makes numerical calculations and then drives the RF power generator to change RF output power so as to enable the plasma density in the plasma fabricating process to be close to the expected plasma density.

2. Description of the Related Art

The developing trend of the semiconductor industry is towards low cost and technology of fabricating wafers with high transistor density. So, to maintain strict operating parameters in the fabricating process is an essential prerequisite for guaranteeing a high product passing rate. Owing to this trend, real-time feedback control is gradually added to the system in the design of semiconductor fabricating equipment in recent years. For example, the equipment that is produced in quantities at present: rapid thermal processing (RTP), and chemical mechanical polishing (CMP), both adopt real-time feedback control to maintain the fabricating quality in the production process.

In the process of fabricating semi conductor components, the plasma process is a very important step. It includes etching, plasma deposition, ashing, wafer cleaning, plasma ion implanting and so on. All these need a stable steady plasma source to complete the fabrication of the semiconductor components. However, owing to the growth and change of the polymer formed by the process on the inner surface of the process container, the plasma density becomes unsteady. Meanwhile the interfering factors of the outer surrounding, such as the variation of power, gas supply and pressure, and the drifting of the input power, will also have influence on plasma source. For example, from FIG. 1 we can see that plasma density is directly proportional to RF input power. When the RF input power in the process container is steady, but the pressure changes, the plasma density will increase along with the increase of pressure. From FIG. 2 we can see that the changes of RF input power and the pressure in the process container have direct influence on the quality of plasma source.

In the process of plasma etching, plasma density has a direct effect on the etching rate and the critical dimension. So if we maintain effectively the steadiness of the plasma density, we can steadily control the etching rate and the quality of critical dimension.

The majority of quantity production plasma process equipment adopt open loop operation mode to control operation parameters, such as air pressure, RF power, gas flow rate, temperature and so on. However, when an abnormal situation of the plasma source in the equipment occurs, it cannot be immediately diagnosed. This often causes waste of cost and delay of delivery. So at present, SPC (statistical process control) mode and neural network mode are commonly adopted in the industry. These modes feedback to revise operation parameters according to the relation of the operation parameters and the component parameters. In this way, they can give early warnings of an abnormal situation of the plasma source and overcome the shortcomings of the open loop operation mode. However, when an abnormal situation of plasma source happens when we are measuring component parameters, there are still wafers in the process of production in the same equipment. Therefore the waste of cost is unavoidable.

In recent years, many research institutes participate actively in the development of real-time control system of plasma process. Sarfaty et al. (Conf. Rec. 1996 IEEE Int. Conf. Plasma Science pp. 281, 1996) used single wavelength and double wavelength laser interference technology as sensors to measure the real-time change of the film on wafers during the process of etching and deposition, and to coordinate with a driving device to form a real-time feedback control system in order to control film etching and growth rate. The main shortcoming of this method is: the process gas easily affects the vacuum windows, causing them to be corroded or deposited so that the accuracy and reliability of the optical measurement is reduced.

Apart from this, Rashap et al. (IEEE Trans. Semiconduct. Manufact., Vol. 10, No. 1, pp. 137–146, 1995) used an optical emission spectroscopy, or, Knight et al. (IEEE Trans. Semiconduct. Manufact., Vol. 10, No. 1, pp.137–146, 1997) used a quadrupole mass spectrometry as sensor that coordinates with a driving device to form a real-time feedback control system in order to control the proportion of certain chemical species in the plasma source, and by controlling the proportion, to control etching rate and deposition rate. The shortcoming of this method is that it requires a relatively longer time to measure the plasma parameters, and consequently, the sampling frequency of the real-time feedback control system will become slower. This will affect the stability of the whole system. The object of the present invention is to provide a process and its system for fabricating plasma with feedback control on plasma density. This process uses a heterodyne millimeter wave interferometer as sensor to measure the plasma density in the process container and the plasma density that is needed in the plasma fabricating process, and then provides real-time information of the measurements to a digital control device which makes numerical calculations and then drives the RF power generator to change RF output power, so as to make dynamic correction on the abnormal situation of plasma source in the process container caused by the drifting of the driving device and external disturbance. In this way, the plasma density in the plasma process will be close to the expected plasma density. This ensures that each wafer in the plasma process is situated in a plasma source of similar density.

The present invention provides a process and its system for fabricating plasma with feedback control on plasma density. The goal of the process is to manufacture stable products through controlling plasma density in the plasma fabricating process. The process is comprised of the following steps: conducting numerical calculations through a controlling device according to the expected plasma density in the process and the measured real plasma density; and regulating the output power of an RF power generator so as to maintain the plasma density close to the expected value.

BRIEF DESCRIPTION OF THE DRAWINGS

The accompanying drawings are included to provide a further understanding of the invention. The drawings illustrate a preferred embodiment of the invention and, together with a detailed description, serve to explain the above and other objects, characteristics, and advantages of the invention. In the drawings.

DESCRIPTION OF THE PREFERRED EMBODIMENTS

According to the plasma global model, the plasma density of inductive plasma source no can be written as:

$$n_o = \frac{P_{abs}}{eu_B A_{eff} \varepsilon_T} \quad \text{formula (1)}$$

Wherein, e: $1.602 \times 10^{-19}$ C $u_B$: Bohm Velocity $P_{abs}$: absorbed power by plasma source $A_{eff}$: effective area $\varepsilon_T$: the total energy lost per ion lost from the system In formula (1), $u_B$, $A_{eff}$, and $\varepsilon_T$ are all the functions of pressure. If the used gas is argon, when input power is fixed, plasma density increases along with the rise of pressure; when pressure is fixed, plasma density is proportioned with the input RF power. Therefore, dynamic regulating of RF power can change plasma density.

Because the phase of an electromagnetic wave will be changed while plasma is in process, we can know the average plasma density no in the plasma source by using the relation of the phase difference and electromagnetic theory. It can be written as follows:

$$n_o = \frac{2 \times \Delta\phi \times n_c}{K_{vac} \times L} \quad \text{formula (2)}$$

Figure 4:
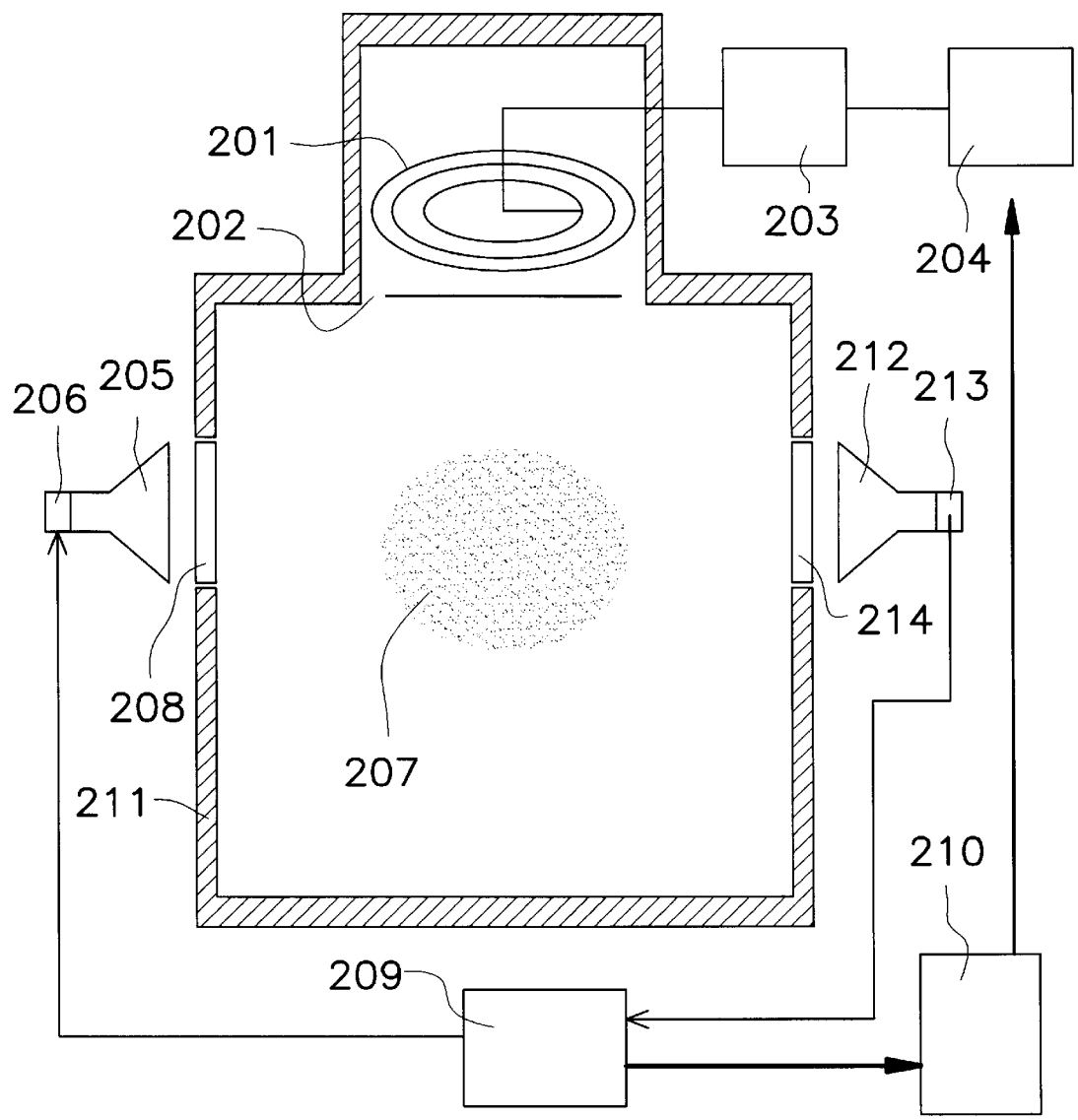
FIG. 4 is a diagram showing the plasma density real-time feedback control system of the present invention.

Wherein, $\Delta\phi$: phase defference $n_c$: critical plasma density $K_{vac}$: microwave wave numbers in vacuum L: the length of the plasma container FIG. 4 is a diagram showing the plasma density real-time feedback control system of the present invention. Please refer to FIG. 4. The present invention uses heterodyne millimeter interferometer 209 as a sensor to measure the plasma density of the plasma source. It uses an RF power generator 204 as driving device to output the power needed by the plasma source and to coordinate with a proper controller 210 design. All these together form a plasma system with plasma density feedback control to reach the goal of making the plasma density steady in the process of fabricating. As a result, it guarantees that different batches of wafers will be operated under similar process plasma conditions during wafer fabricating and will not be affected by the interference of the surrounding factors to the plasma density in the plasma source process. Meanwhile, it can rapidly correct the change of plasma density in the process plasma source caused by the drifting phenomena of other driving devices so as to obtain a process plasma source with steady quality. Besides, the sensor adopted by the present invention is heterodyne millimeter wave interferometer 209, which is not influenced by the light plasma of source and which processes signals rapidly. This kind of interferometer is very suitable to be used for the future plasma equipment.

Figure 1:
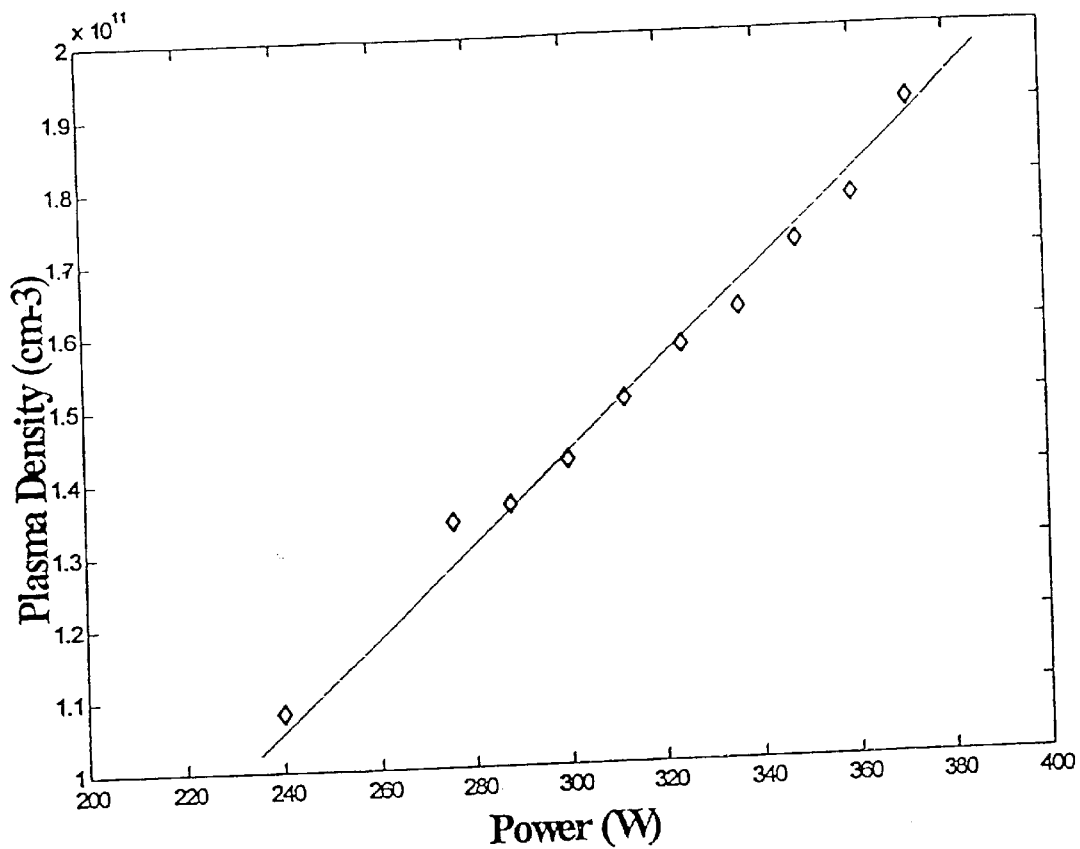
FIG. 1 shows the relation between the RF input power and the plasma density.
Figure 2:
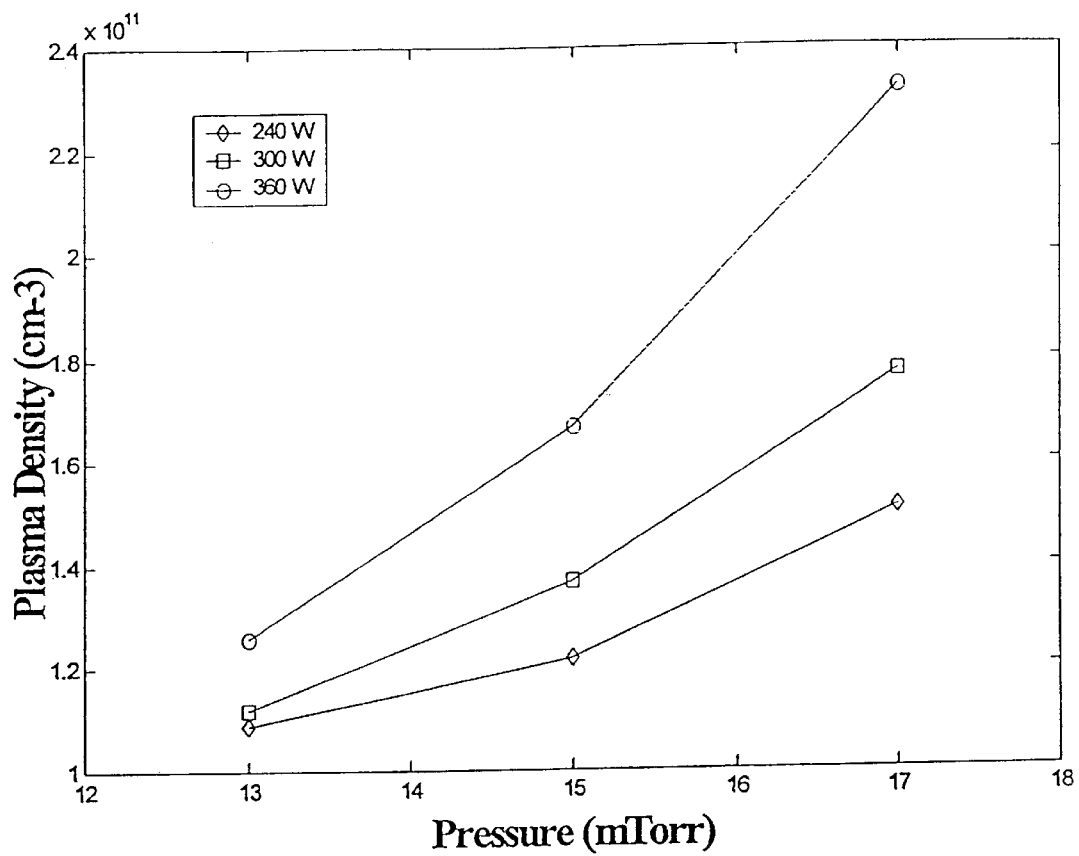
FIG. 2 shows the relation between the pressure and plasma density.
Figure 3:
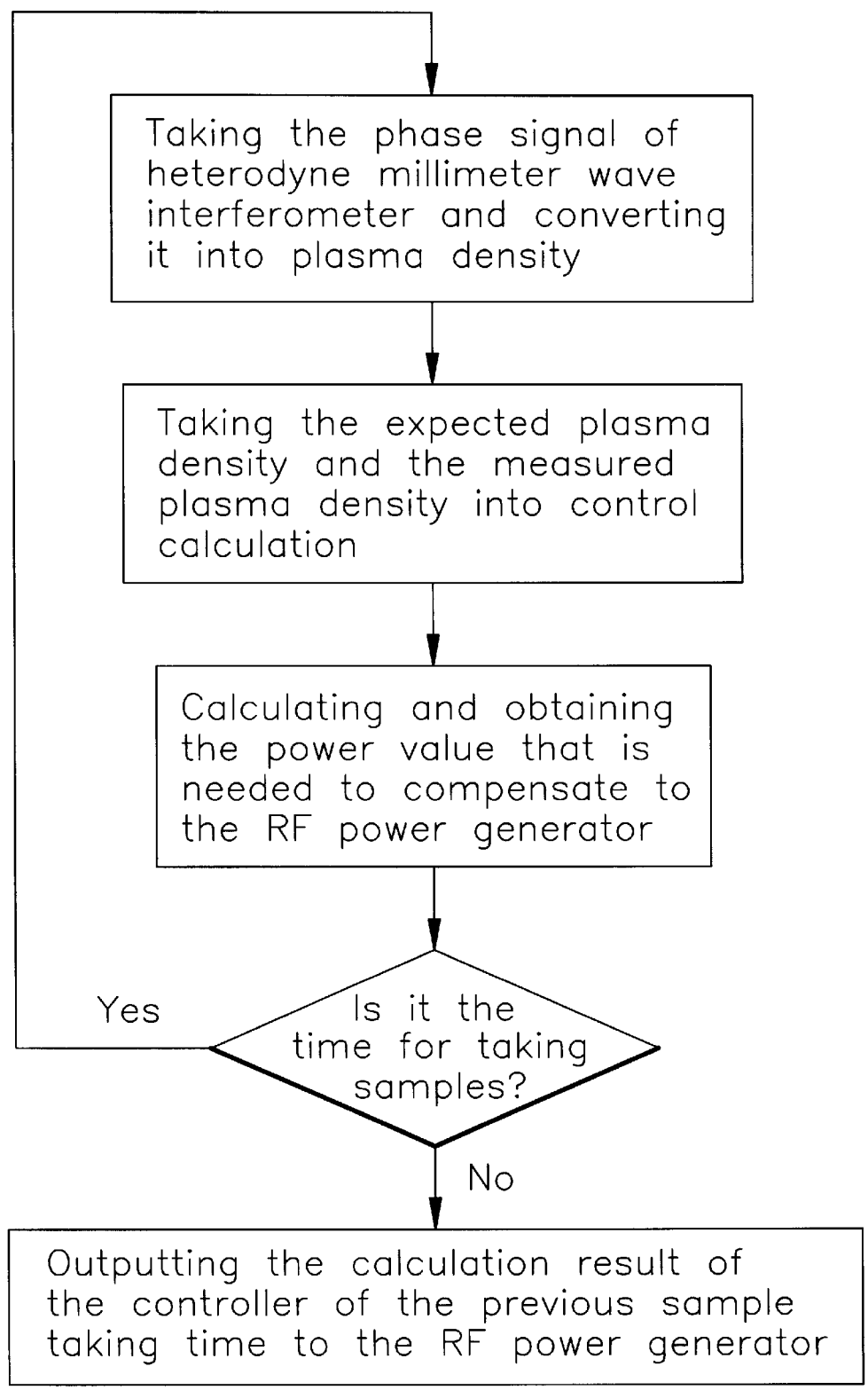
FIG. 3 is a flow diagram showing the control algorithm in the present invention.

The present invention discloses a plasma process, which utilizes a plasma density feedback control to control the plasma density of the process plasma source, so as to reach the goal of producing stable products. It includes the following steps: the controller conducts numerical calculations based on the expected plasma density in the process and the measured real plasma density; then it regulates the output power of a RF power generator so as to keep the plasma density close to the expected value. For more detailed steps, please refer to FIG. 3, which is a flow diagram the of plasma process.

Please continue to refer to FIG. 4. In FIG. 4, the heterodyne millimeter wave interferometer 209 inputs a 36 GHz millimeter wave signal, which passes through the isolator 206 and the horn antenna 205 at the emission end, and then penetrates the microwave lens at the emission end 208 and the plasma source 207 and reaches the microwave lens at the receiving end 214. The 36 GHz millimeter wave signal, whose phase has now been affected by the plasma source, penetrates the microwave lens 214, a receiving antenna 212 and the isolator 213 at the receiving end and is sent back to the heterodyne millimeter wave interferometer circuit 209 to have a wave mixing process with a 35.93 GHz millimeter wave signal that does not pass through the plasma source. In this way, we can obtain the phase change. Afterwards, through the calculation in the computer 210 that is used for measuring and controlling according to formula (2), we can obtain the plasma density in the process vacuum container 211. The vacuum container 211 generally surrounds a wafer support (not shown in the drawing) and there is plasma 207 and reaction gas in the container. Through the calculation of the controller in the computer 210 based on the expected plasma density needed in the general plasma process and the measured plasma density in the process vacuum container 210, we can get the output power needed by the independent RF power generator 204. Then through the matching network 203, the independent RF power generator 204 transmits the RF power to the coil or electrode 201 so as to control the plasma density of the plasma source 207 in the process vacuum container 211. Wherein the quartz plate 202 is an insulating device that is used to insulate the coil 201 from the gases, ions, electrons and other matter. On the other hand the quartz plate 202 allows the electric and magnetic fields to penetrate.

Figure 5:
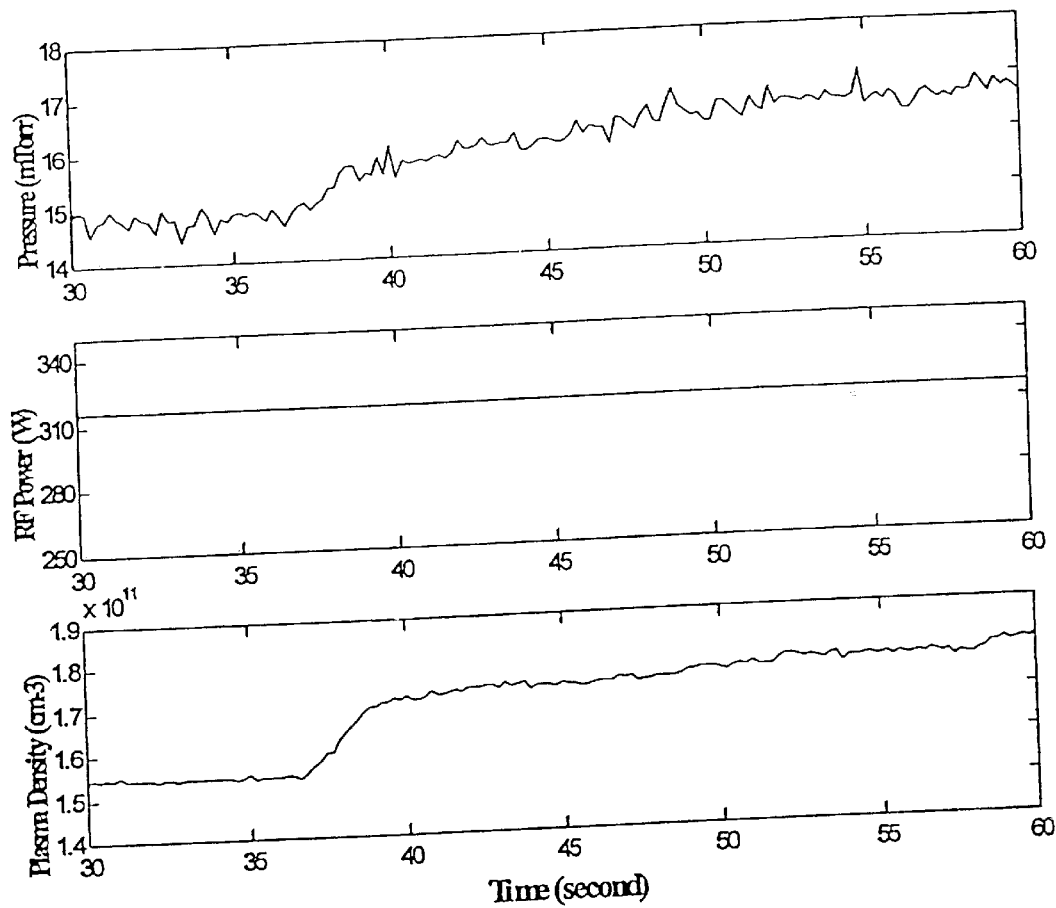
FIG. 5 shows the dynamic changing situation of the plasma density in a conventional process caused by the change of pressure when the RF input power is fixed.

We take argon in an inductive plasma system to prove the effectiveness of the present invention. Under traditional operation, when RF power=316 W, pressure=15 mTorr, gas flow quantity=15 sccm, the plasma density is $1.55 \times 10^{11}$ cm$^{-3}$. As shown in FIG. 5, if the pressure rises from 15 mTorr to 17 mTorr as the result of the drifting of the driving device in the system, the plasma density will rise to 1.78×

$10^{11}$ cm$^{-3}$. We can see that external disturbances and the drifting of other driving devices easily effect the quality of the process plasma source of the traditional plasma process.

Embodiment 1

Figure 6A:
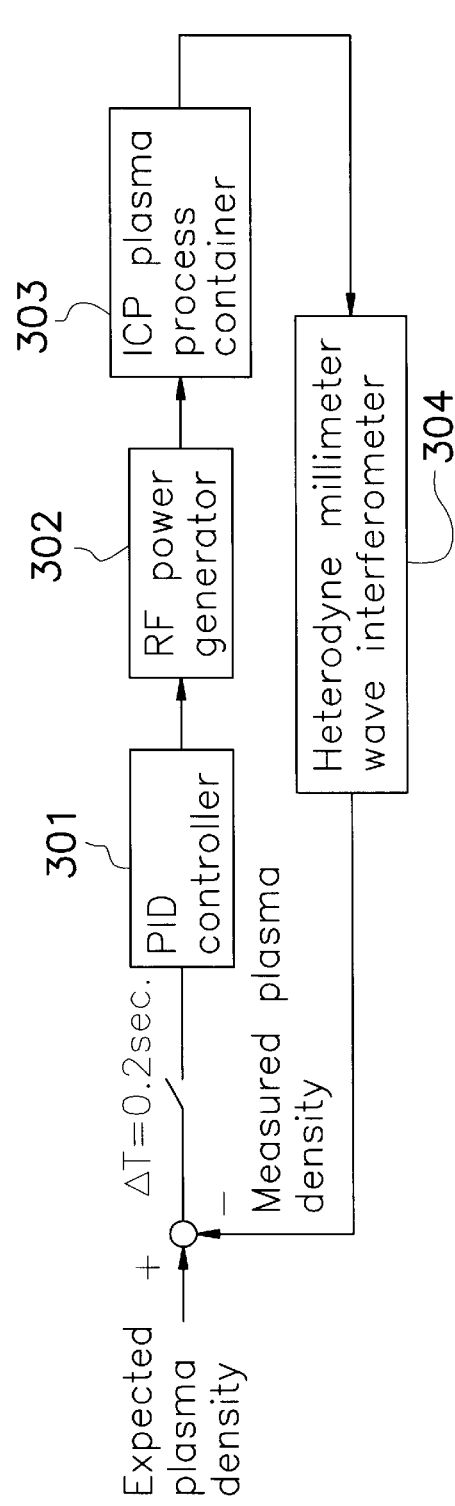
FIG. 6(a) is a block diagram of the system of embodiment 1 according to the present invention.

FIG. 6(a) is a block chart of embodiment 1. A digital proportional-integral-differential controller 301 is used as the controller of the present invention.

Definition:

Error E=expected plasma density—the plasma density measured by the interferometer The pressure output to the RF power generator U The sampling time ΔT $$U=K_p*E+K_D*(E-E_{old})/\Delta T+K_I*SUM(E*\Delta T)$$

Wherein, $K_P$ is 0.564, $K_I$ is 0.84, $K_D$ is 0.08, and ΔT is 0.2 second.

Figure 6B:
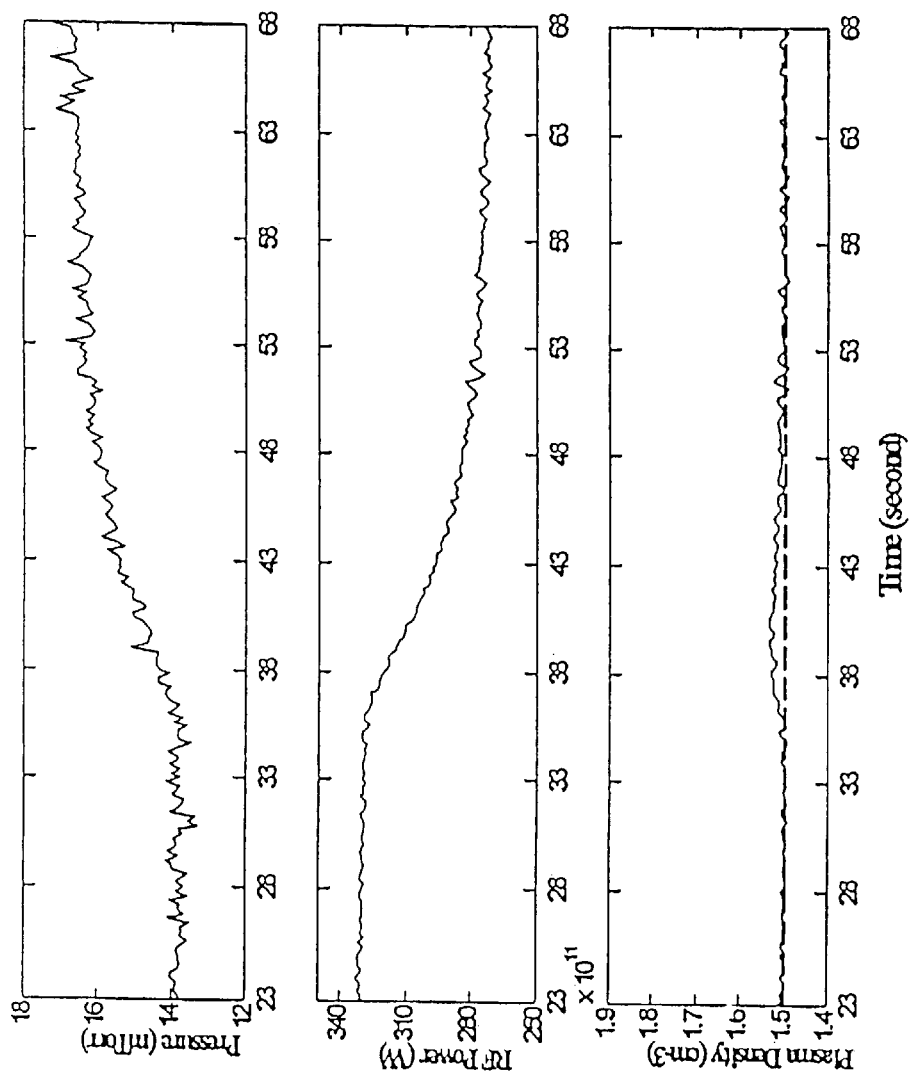
FIG. 6(b) is a diagram showing the measured situation of embodiment 1 according to the present invention. It shows the dynamic change of plasma density and RF input power under changing pressure.

In FIG. 6(b), we take argon in an inductive plasma system to prove the effectiveness of the present invention. Suppose the expected plasma density is $1.5\times10^{11}$ cm$^{-3}$. By using the digital proportional-integral-differential controller to control the output power of the RF power generator, the plasma density measured by the heterodyne millimeter wave interferometer is kept at $1.5\times10^{11}$ cm$^{-3}$. Likewise when we make the pressure change as if there is drifting of the driving device, the digital proportion-integration-differentiation controller can dynamically correct the output power of the RF power generator and again keep the plasma density in the process container at $1.5\times10^{11}$ cm$^{-3}$. Therefore the present invention can guarantee stable quality of the plasma source in a plasma process.

Embodiment 2

Figure 7A:
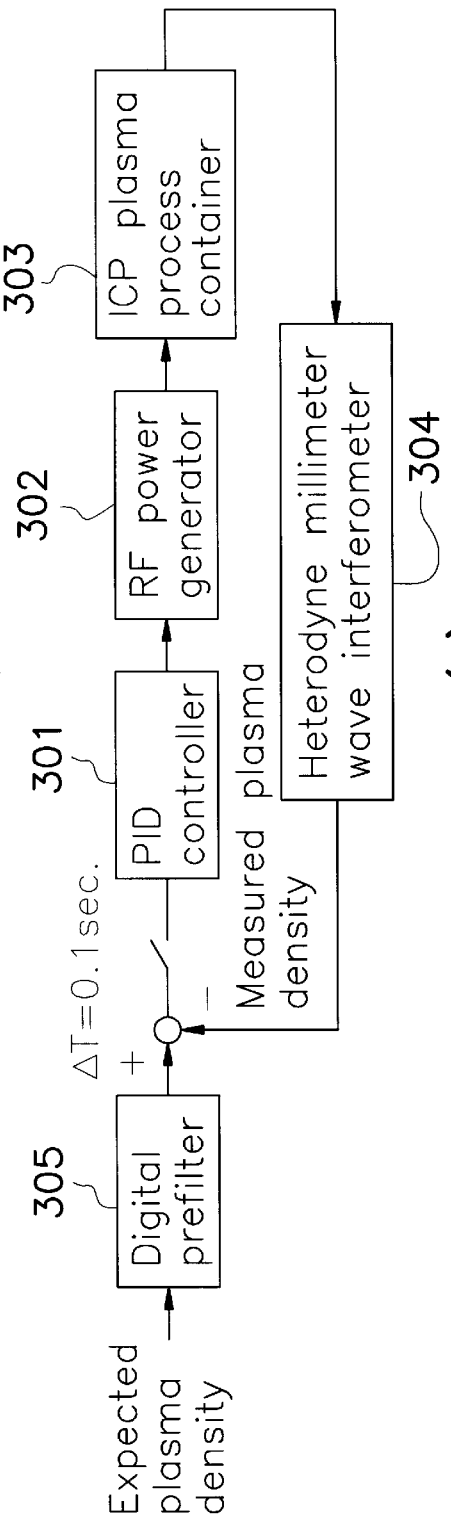
FIG. 7(a) is a block diagram showing the system of embodiment 2 according to the present invention.

FIG. 7 is a system block chart of embodiment 2. In this embodiment, we use digital prefilter 305 and digital proportional-integral-differential (PID) controller 301 as the controller of the present invention.

Definition:

Error E=expected plasma density—the plasma density measured by the interferometer The pressure output to the RF power generator U The sampling time ΔT The operator of Z-transform is z Digital prefilter $$G(z) = \frac{0.1813}{z - 0.8187}$$

digital proportional-integral-differential controller:

$$U=K_p*E+K_D*(E-E_{old})/\Delta T+K_I*SUM(E*\Delta T)$$

wherein, $K_p$ is 0.564, $K_I$ is 0.84, $K_D$ is 0.08, and ΔT is 0.1 second.

Figure 7B:
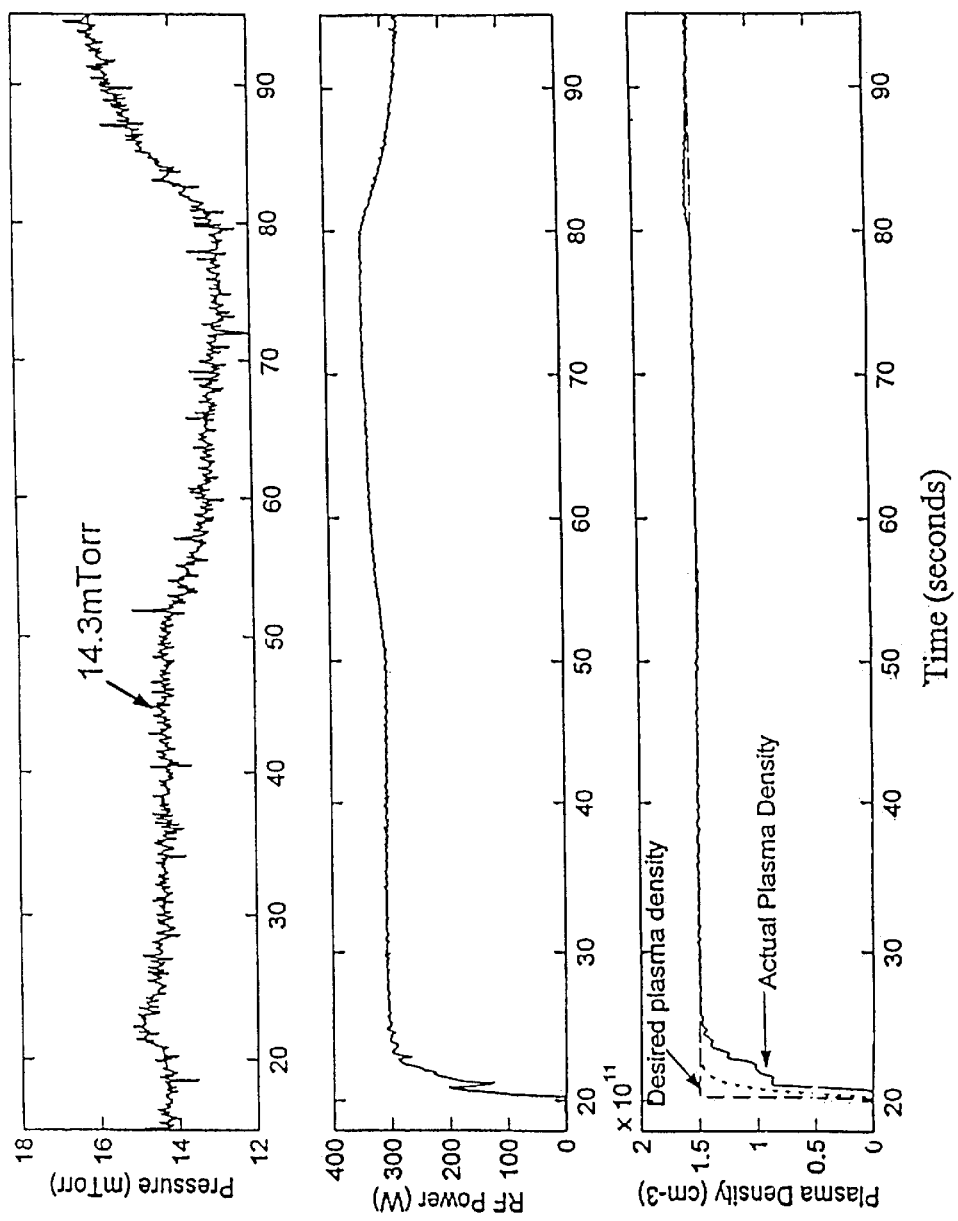
FIG. 7(b) is a diagram showing the measured situation of embodiment 2 according to present invention. It shows the dynamic change of plasma density and RF input power under changing pressure.

In FIG. 7(b), we take argon in an inductive plasma system to prove the effectiveness of the present invention. Suppose the expected plasma density is $1.5\times10^{11}$ cm$^{-3}$. By using the digital proportional-integral-differential controller to control the output power of the RF power generator, the plasma density measured by the heterodyne millimeter wave interferometer is kept at $1.5\times10^{11}$ cm$^{-3}$. Likewise when we make the pressure change as if there is drifting of the driving device, the digital proportional-integral-differential controller can dynamically correct the output power of the RF power generator and again keep the plasma density in the process container at $1.5\times10^{11}$ cm$^{-3}$. Therefore the present invention can guarantee stable quality of the plasma source in a plasma process.

In addition, the controller of this embodiment also overcome the shortcoming of the momentary unsteadiness of plasma density at the moment of plasma ignition, which heats the process plasma and leads to an increase of gas temperature and pressure change in the container.

The Advantages of the Present Invention:

(1) It can effectively compensate for the change of plasma density caused by disturbances of the external surrounding and the drifting of other driving devices.

(2) It guarantees that wafers of different batches can be operated under process plasma sources of similar quality in the wafer fabricating process.

(3) The heterodyne millimeter wave interferometer, which is used as a sensor for feedback control, is not easily disturbed by the process gases or the pollution of the resultants.

(4) It can immediately diagnose the abnormality in a process plasma source.

Table 1 is a comprehensive contrast between the prior arts and the present invention from the angles of sensor, controller, and speed. We can see from the table that the present invention has advantages over the prior arts in the aspects of speed, and application limitation.

TABLE 1 a contrast of characteristics between the prior arts and the present invention

|  | The present invention | Applied Materials Corp. | University of Wisconsin (Sarfaty) | University of Michigan (Rashap) | Connegie Mellon University | Lam Research Corp. |
| --- | --- | --- | --- | --- | --- | --- |
| Real-time feedback control or monitoring | Real-time feedback control | Monitor-ing | Real-time feedback control | Real-time feedback control | Real-time feedback control | Monitoring |
| Sensor or measuring device | Heterodyne millimeter wave interferometer | Impedance meter | Double wave-length laser interferometer | Optical Emission Spectroscopy | Quadrouple mass spectrometry | Ellipsometer |
| Measuring parameter (or, the parameter that is intended to be controlled | Plasma density | Plasma impedance | The change of the film thickness | Plasma species density | Material density | The change of the film thickness |

TABLE 1-continued a contrast of characteristics between the prior arts and the present invention

|  | The present invention | Applied Materials Corp. | University of Wisconsin (Sarfaty) | University of Michigan (Rashap) | Connegie Mellon University | Lam Research Corp. |
|---|---|---|---|---|---|---|
| Plasma machine | ICP | PECVD | MEICP | RIE | PECVD | ICP |
| The kind of controller | PID PID + Forward, QFT | Without | PID + Feed-forward | LQP/LTR | LQP/LTR | Without |
| Speed (time for taking sample) | 0.2 second | 0.5 second (at present it can be 0.1) | 0.2 second is the fastest (limited by the integrate time of light | 0.2 second is the fastest (limited by the integrate time of light | 3 seconds | Not known |
| Limitation | The stray signal of high frequency components (can be reduced through temperature control system) | Not direct plasma parameter | Optical lens contaminated | Optical lens contaminated | Needed to be put into process container and will contaminate process quality | Optical lens contaminated |

To sum up, we know that the present invention is utilizable in industry, and it is original and progressive. The invention has not been seen in any publication. Therefore, it fits the stipulations of the patent law.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A plasma process with plasma density feedback control, comprising:

using a plasma source to process wafers in a vacuum container;

conducting a monitoring step to monitor a change of plasma density of the process plasma source; and sending out a voltage signal to an RF power generator to enable it to dynamically regulate the RF power that is sent out to the vacuum container so as to make the plasma density steady, wherein the output of the voltage signal is decided after a controller conducts a numerical value calculation based on the plasma density and an expected plasma density needed in a plasma process.

2. A plasma process with plasma density feedback control according to claim 1, wherein a heterodyne millimeter wave interferometer is used in the monitoring step to measure phase change when the millimeter wave is transmitting through the plasma source and obtain plasma density in the vacuum container.

3. A plasma process with plasma density feedback control according to claim 1, wherein the controller is either a digital signal processor or a computer program calculation device.

4. A plasma process system with plasma density feedback control, comprising:

a vacuum container, to contain plasma and reacting gas;

a plasma producing electrode, which can operate to produce the plasma in the vacuum container;

an RF power generator that provides RF power and sends energy to the plasma through the plasma producing electrode;

a heterodyne millimeter wave interferometer, located outside the vacuum container, wherein a pair of millimeter wave emission antennae and receiving antennae, millimeter wave penetrates a pair of lenses on the wall of the vacuum container and measures the average plasma density of the plasma in the vacuum container; and a controller, wherein the numerical calculation based on the average plasma density is measured by the heterodyne millimeter wave interferometer and the expected plasma density needed for the plasma process, the controller outputs a voltage signal to the RF power generator to enable it to regulate in a dynamic way the RF power that is sent out to the vacuum container.

5. A plasma process system with plasma density feedback control according to claim 4, wherein the controller is either a digital signal processor or a computer program calculation device.

6. A plasma process system with plasma density feedback control according to claim 4, wherein the pair of lenses in the heterodyne millimeter wave interferometer includes a pair of quartz lenses.

7. A plasma process system with plasma density feedback control according to claim 4, wherein the plasma producing electrode includes a coil.

* * * * *